INVENTOR.
MICHAEL V. D'AGOSTINO
BY John V. Regan
Attorney 3,431,505

EMITTER FOLLOWER CIRCUIT HAVING SUBSTANTIALLY CONSTANT CURRENT EMITTER SUPPLY

Michael V. D'Agostino, Flemington, N.J., assignor to Radio Corporation of America, a corporation of Delaware Filed Oct. 26, 1964, Ser. No. 406,376
U.S. Cl. 330—14 3 Claims
Int. Cl. H03f 3/04, 3/68, 1/00

ABSTRACT OF THE DISCLOSURE

Disclosed herein is a current steering circuit having an emitter follower output. A substantially constant current source is connected in the emitter circuit of the emitter follower transistor to provide linear charge (or discharge) of the load capacitance upon switching.

Emitter coupled current steering logic gates have a very high speed of response because the transistors are not operated in saturation. Such a gate may employ a plurality of transistors having their emitters connected to a common resistor which simulates a current source. Current is steered through one or the other transistor branch depending upon the inputs to the transistors. In one arrangement employing gates of this type, the outputs of the gate are applied as inputs to a pair of emitter followers which serve to isolate the output loads from the gate transistors, furnish current gain, and provide the desired level shift for signal level compatibility throughout the system.

The output loads, signal leads, etc. connected at the output of an emitter follower introduce capacitance at the output of the emitter follower. When the output of the gate changes from one level to another, this capacitance must be charged or discharged before the voltage at the output of the emitter follower can change to its new value. When the output signal of the gate changes from a first value to a second value representing increased drive to the emitter follower, the capacitance discharges (or charges) rapidly through the emitter follower transistor. However, when the gate output changes from the second value to the first value the capacitance tends to maintain the output voltage with the result that the emitter follower transistor is cut-off temporarily by the rapid change in the output voltage of the gate. The capacitance then must charge (discharge) through the emitter resistor of the emitter follower, which normally is chosen to have a relatively high value in order to limit power dissipation and the loading at the output of the gate. The result of the above is an increased signal delay between the input to the gate and the output of the emitter follower.

It is one object of this invention to improve the response time of an emitter follower with respect to rapidly changing signal input conditions when there is capacitance at the output of the emitter follower.

It is another object of this invention to improve the speed of response of an emitter follower without increasing the power dissipation therein or, alternatively, to reduce the power dissipation in the emitter follower without reducing its speed of response.

It is still another object of this invention to improve the response time of an emitter coupled current steering logic arrangement.

These objectives are achieved in a circuit arrangement embodying the invention by replacing the relatively large emitter follower resistor by a source of substantially constant current, whereby the capacitance is discharged linearly rather than exponentially. The current source preferably comprises a transistor of the same conductivity type as the emitter follower transistor having a resistor connected in its emitter circuit and having a relatively fixed bias voltage applied at its base.

Figure 1:
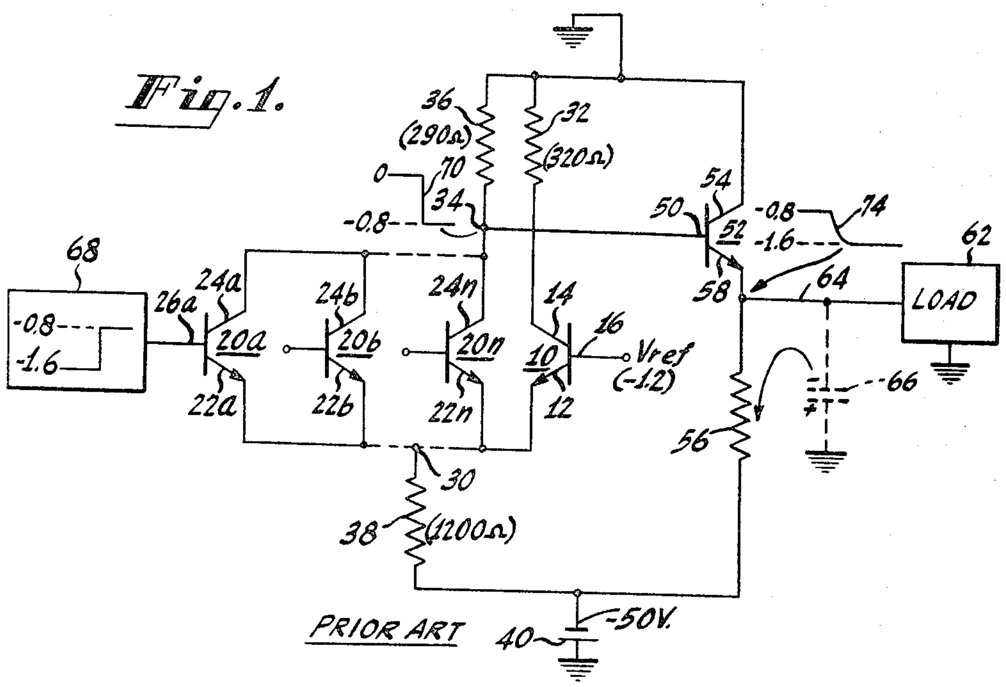
Figure 2:
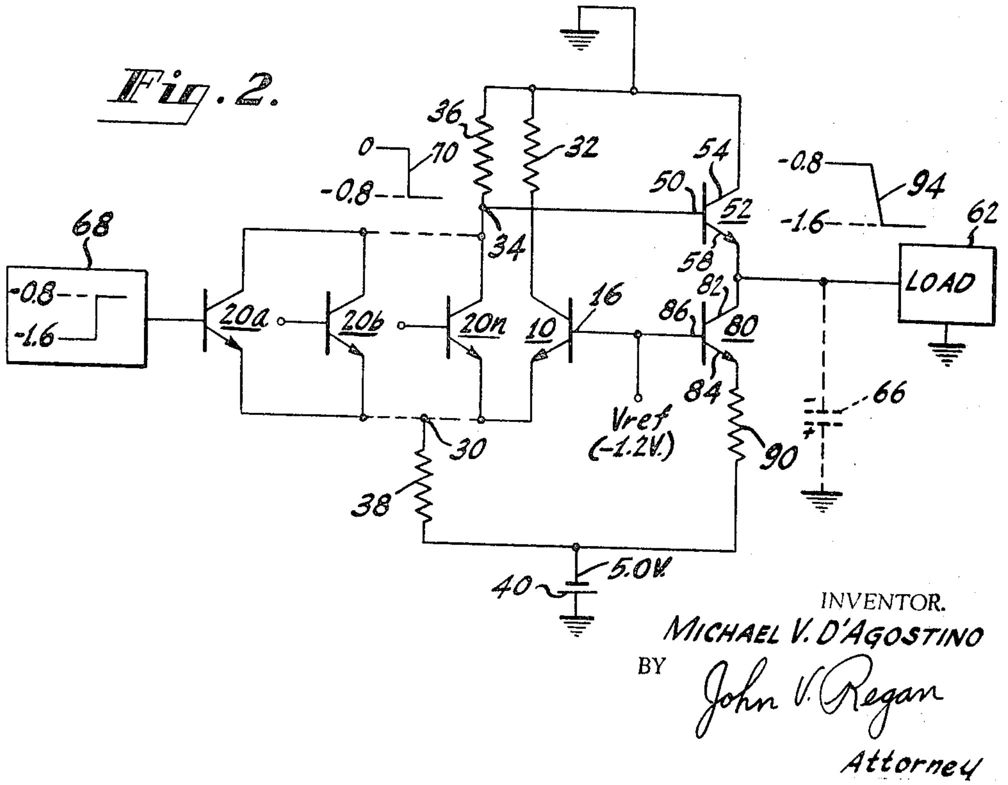

In the accompanying drawing, like reference characters denote like components: and FIGURE 1 is a schematic diagram of an emitter coupled current steering logic arrangement according to the prior art; and FIGURE 2 is a schematic diagram of the improved emitter coupled current steering logic arrangement embodying the invention.

The emitter coupled current steering logic arrangment of the prior art includes a first transistor 10 of one conductivity type, illustrated as NPN type, connected in a first circuit branch, and a plurality of transistors 20*a* . . . 20*n* of the same one conductivity type connected in parallel in a second circuit branch. In particular, first transistor 10 has its emitter 12 connected to a junction point 30 and has its collector 14 connected by way of a supply resistor 32 to a point of substantially fixed voltage, illustrated in the drawing by the conventional symbol for circuit ground. The base 16 of first transistor 10 is connected to a source of fixed bias which, preferably, is a temperature regulated power supply (not shown). Each of the transistors 20*a* . . . 20*n* in the second branch has its emitter 22*a* . . . 22*n* connected directly to the common junction point 30. The collectors 24*a* . . . 24*n* of these latter transistors are connected directly together and by way of a common collector supply resistor 36 to circuit ground. A common emitter resistor 38 is connected between junction point 30 and the negative terminal of a suitable source of bias potential, illustrated as a battery 40 having its positive terminal grounded.

The collectors 24*a* . . . 24*n* also are connected directly to the base 50 of another transistor 52 of the same conductivity type. Transistor 52 is connected as an emitter follower by connecting its collector 54 directly to circuit ground. A resistor 55 is connected between the emitter 58 and the negative terminal of battery 40.

The output load, which may be one or more transistors of other emitter coupled current steering gates is represented by a box 62 connected at the emitter 58 of the emitter follower transistor 52. The signal leads, 64 for example, connecting the load 62 to the emitter 58 introduce capacitance at the emitter 58. In addition, the load itself has capacitance, such as the combined input capacitances of the load transistors (not shown) which appears at the emitter 58 of transistor 52. The total capacitance is represented in the drawing by dashed capacitor 66. The effect of this capacitance 66 in the high speed circuit can best be seen by describing the operation of the circuit.

For tutorial purposes, consider that the reference voltage applied at the base 16 of first transistor 10 has a value of —1.2 volts, battery 40 has a voltage of —5 volts, and the separate input signals applied at the bases 26*a* . . . 26*n* of the transistors 20*a* . . . 20*n*, respectively, have either a value of —1.6 volts or —0.8 volt. Thus, the reference voltage at base 16 has a value midway between the input signal levels. The input signal to base 26*a* is supplied from a source 68, which could be the output of the emitter follower in another circuit of the type illustrated schematically in the drawing. The inputs (not shown) to transistors 20*b* . . . 20*n* could come from similar circuits also. The various resistors may have the values given in the drawing by way of example.

Consider first the operation of the gate, and let it be assumed that the inputs to all of the transistors 20*a* . . . 20*n* have the lower value of —1.6 volts. The voltage applied at the base 16 of first transistor 10 is more positive than the signal voltages, whereby first transistor 10 conducts. Assuming silicon transistors with a forward emitter-base diode voltage drop of 0.8 volt, the voltage at common emitter junction 30 is —2 volts for this operating condition. All of the other transistors 20*a* . . . 20*n* are "off" at this time and the current through common emitter resistor 30 flows through the transistor 10 to the exclusion of the transistors 20*a* . . . 20*n*. Accordingly, the voltage at junction 34 at the collectors 24*a* . . . 24*n* is at ground potential (assuming no current flow through collector resistor 36, to be discussed).

Consider now the condition where the input signal applied at the base 26*a* of transistor 20*a* rises from —1.6 volts to —0.8 volt. The base 26*a* voltage now is sufficiently positive with respect to the emitter 22*a* voltage to bias transistor 20*a* into conduction. The voltage at emitter 22*a* follows the base 26*a* voltage, and differs therefrom by an amount equal to the drop across the forward biased emitter 22*a*-base 26*a* junction, which as previously discussed is approximately 0.8 volt. Accordingly, the voltage at common emitter junction 30 rises to —1.6 volts and turns off first transistor 10. The value of the collector resistor 36 is chosen so that the current flowing through common emitter resistor 38 and the emitter 22*a*-collector 24*a* path of transistor 20*a* provides a voltage drop of 0.8 volt across collector resistor 36.

It is thus seen that the output voltage at point 34 has either a value of zero volts or —0.8 volt, depending upon the input signal conditions. This output voltage represents a level shift from the input signal values and requires, in most applications, circuitry for restoring the output voltage to the same level as the input voltage before application to other circuits. Also, it is desired to provide a buffer between point 34 and the loads so that a large current does not flow through collector resistor 36 and upset the output signal levels at point 34. It should also be noted that the transistors 10 and 20*a* . . . 20*n* are never operated in saturation, whereby these transistors have a very high speed of response, and the output voltages thereof may change very rapidly upon a change in input signal conditions. In other words, the rise and fall times of the output signal 70 are of the same order as the fall and rise times, respectively, of the input signals, which may be very short.

Consider now the response of the emitter follower to a change in output voltage at the collectors 24*a* . . . 24*n*. When the signal 70 applied at the base 50 of emitter follower transistor 52 has a value of —0.8 volt, the voltage at the emitter 58 thereof has a value of —1.6 volts. The capacitance 66 then is charged to —1.6 volts in the polarity direction indicated. When the signal voltage 70 applied at base 50 changes from —0.8 volt to zero volts, the capacitance 66 attempts to hold the emitter 58 at —1.6 volts, and must be discharged to —0.8 volt before the output voltage at emitter 58 reaches its steady state value of —0.8 volt. The change in base 50 voltage, however, is in a polarity direction to increase conduction in transistor 52, and capacitor 66 may be discharged rapidly to —0.8 volt by the current flow through the low impedance path of the transistor. When the signal voltage 70 applied at base 50 changes from zero volts to —0.8 volt, however, the capacitance 66 must charge to —1.6 volts before the emitter 58 reaches its steady value.

The effect of the capacitance 66 at the first instant of the transient is to maintain the emitter 58 voltage at —0.8 volt, which is the same as the newly applied signal at base 50. As a result of the action of the capacitance 66, therefore, emitter follower transistor 52 will turn off temporarily when the input thereto changes rapidly from zero volts to —0.8 volt. Capacitance 66 then must charge through the emitter resistor 56 in the direction indicated by the arrow. The capacitance 66 charges exponentially at a rate determined by the RC time constant of the charge path. As may be seen by the signal waveform 74 adjacent emitter 58, the cutting off of transistor 52 and the exponential charging of capacitance 66 results in increased signal delay between the inputs to the transistors 24*a* . . . 24*n* and the output at the emitter 58.

This delay, and the charge time of the capacitance 66 may be decreased by decreasing the value of resistor 56. In general, however, resistor 56 is selected to have a relatively high value for several reasons. First, a relatively large emitter resistor 56 results in a relatively low power dissipation, which is important when the circuit is fabricated in integrated form. Secondly, the larger the resistor 56 the smaller the emitter 58 current and the smaller the base 50 current. As may be seen in the drawing, the base 50 current flows through the collector resistor 36, and this base 50 current should be held to a low value lest the resulting voltage drop across collector resistor 36 cause a shift in the output signal 70 at the collectors 24*a* . . . 24*n*. In the improved arrangement embodying the invention, the charge time of capacitor 66, and hence the total signal delay between the input and output of the overall arrangement, may be greatly reduced without an increase in the emitter 58 current.

The arrangement embodying the invention is illustrated in FIGURE 2. Except for the emitter 58 circuitry, the components are the same as those illustrated in FIGURE 1 and need not be described further. The emitter 58 circuitry comprises a transistor 80 of the same conductivity type as the emitter follower transistor 52 and having its collector 82 directly connected to the emitter electrode 58. That is to say, the collector 52 is connected to the emitter 58 by negligible impedance means. A resistor 90 is connected between the emitter 84 of transistor 80 and the negative terminal of battery 40. Base 86 is connected to a point of substantially constant voltage, such as the reference voltage source to which the base 16 of first transistor 10 is connected. In any event, the voltage applied at base 86 has a magnitude and potential to bias transistor 80 in the "on" condition and, together with resistor 90, cause transistor 80 to operate as a substantially constant current device.

As in the case of the FIGURE 1 circuit, capacitance 66 may discharge rapidly through the emitter follower transistor 52 when the voltage at the base 50 thereof rises rapidly from —0.8 volt to ground potential. However, whereas the capacitance 66 in the FIGURE 1 circuit was caused to charge exponentially through the emitter resistor 56 when the base 50 voltage fell from ground potential to —0.8 volt, the capacitance 66 in the FIGURE 2 arrangement charges linearly as a result of the constant current device. This may be seen by a comparison of the output waveform 94 in FIGURE 2 with the output wave 74 in FIGURE 1. Because the charge current has a fixed and constant value in the FIGURE 2 arrangement, more charge is supplied to the capacitance 66 during a given interval of time T then is supplied through the resistor 56 in FIGURE 1 for the same quiescent power dissipation in the emitter circuitry. Alternatively, the capacitance 66 may be charged the same amount in the FIGURE 2 arrangement as the capacitance 66 in the FIGURE 1 arrangement during the same time interval, but with less power dissipation.

By charging the capacitance 66 more rapidly, the total signal delay from the input of any of the transistors 20*a* . . . 20*n* to the output at emitter 58 is much less in the FIGURE 2 arrangement then in the FIGURE 1 arrangement. For example, in the FIGURE 1 circuit with no capacitive loading at the emitter 58 the total delay is approximately twelve nanoseconds from input to output with a fanout of six. By "fanout" is meant the number of other similar circuits driven from the emitter follower. However, when fifty pf. (picofarads) of capacitance is added at the emitter 58, the pair delay increases to thirty-three nanoseconds for the same power dissipation. The total pair delay in the FIGURE 2 circuit arrangement was measured as twenty-six nanoseconds for the fifty pf. capacitive loading condition.

Although the circuit has been illustrated and described as employing NPN type transistors, it will be apparent to those skilled in the art that the circuit will function with PNP type transistors, provided that the connections to the battery 40 are reversed, and provided also that the input signal levels have the proper values. Also, the output at the collector 14 of first transistor 10 may be applied to another emitter follower circuit of the type described and illustrated.

What is claimed is:

1. The combination comprising:

first and second transistors of one conductivity type each having a collector, a base and an emitter;

means connecting the base of the first transistor to a point of relatively fixed potential;

means for applying input signals at the base of the second transistor, said input signals having either a first value which is greater than said fixed potential or a second value which is less than said fixed potential;

a resistor having one end connected in common to the emitter electrodes of the first and second transistors and having its other end connected to a first point of potential having a value to forward bias the emitter-base junction of a different one of the first and second transistors for each different input signal value;

a resistor connected between (a) the collector of one of the first and second transistors and (b) a second point of potential having a value to reverse bias the collector-base junction thereof;

means direct current conductively connecting the collector of the other one of the first and second transistors to said second point of potential;

a third transistor of said one conductivity type having a base connected by negligible impedance means to the collector of said one of said first and second transistors, a collector direct current conductively connected to said second point of potential, and an emitter;

load means connected at the emitter of said third transistor and having capacitance; and substantially constant current means connected in circuit between the emitter of the third transistor and a point of reference potential.

2. The combination comprising:

first and second transistors of one conductivity type each having a base, a collector and an emitter;

means for connecting the base of the first transistor to a point of relatively fixed potential;

means for applying input signals at the base of the second transistor, said input signals having either a first value that is greater than said fixed potential or a second value which is less than said fixed potential;

a first resistor having one end connected in common to the emitters of the first and second transistors;

first and second impedance means each having one end connected to the collector of a different one of the first and second transistors;

means for connecting a source of operating potential between the other end of said first resistor and the other end of each of said impedance means;

a third transistor of said one conductivity type having a base connected by negligible impedance means to the collector of one of the first and second transistors, a collector connected by negligible impedance means to a point of fixed potential, and an emitter;

load means connected at the emitter of said third transistor and introducing capacitance at that emitter;

a fourth transistor having a collector connected to the emitter of the third transistor, a base connected to a point of substantially fixed potential, and an emitter; and a resistor connected between the emitter of said fourth transistor and the other end of said first resistor.

3. The combination as claimed in claim 2, wherein the value of the fixed potential applied at the base of the first transistor is midway between the two values of the input signals.

References Cited

UNITED STATES PATENTS

| | | | |
|---|---|---|---|
| 3,271,691 | 9/1966 | Hendon et al. | 330—17 |
| 3,320,543 | 5/1967 | Hopengarten | 330—30 XR |
| 2,874,315 | 2/1959 | Reichert | 307—106 |
| 2,997,606 | 8/1961 | Hamburger et al. | 307—88.5 |
| 3,177,372 | 4/1965 | Greiner | 307—297 |
| 3,178,651 | 4/1965 | Kegelman | 330—18 X |
| 3,197,709 | 7/1965 | Antonio et al. | 330—18 |
| 3,214,706 | 10/1965 | Mollinga | 330—18 X |
| 3,262,062 | 6/1966 | Langan | 330—18 X |

OTHER REFERENCES

Motorola Co., Semiconductors, August 1963, p. 1. Circuit Schematic, pp. 10–24.

NATHAN KAUFMAN, *Primary Examiner.*

U.S. Cl. X.R.

330—30, 69